United States Patent
Kuramoto

(10) Patent No.: US 7,680,172 B2
(45) Date of Patent: Mar. 16, 2010

(54) LASER DIODE DEVICE

(75) Inventor: Masaru Kuramoto, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/519,951

(22) Filed: Sep. 13, 2006

(65) Prior Publication Data

US 2007/0071050 A1 Mar. 29, 2007

(30) Foreign Application Priority Data

Sep. 15, 2005 (JP) ............................ 2005-268010

(51) Int. Cl.
*H01S 5/026* (2006.01)
(52) U.S. Cl. ................. 372/50.21; 372/43.01
(58) Field of Classification Search ............. 372/43.01, 372/50.21, 50.122
See application file for complete search history.

(56) References Cited

U.S. PATENT DOCUMENTS

| | | | | |
|---|---|---|---|---|
| 4,852,108 | A * | 7/1989 | Utaka et al. | 372/20 |
| 4,856,005 | A * | 8/1989 | Oe et al. | 372/96 |
| 6,281,032 | B1 | 8/2001 | Matsuda et al. | |
| 6,368,890 | B1 | 4/2002 | Wickstrom et al. | |
| 6,547,451 | B1 | 4/2003 | Nishikawa et al. | |
| 6,643,310 | B2 | 11/2003 | Nemoto et al. | |
| 6,653,662 | B2 | 11/2003 | Otsuka et al. | |
| 6,674,784 | B2 * | 1/2004 | Takiguchi et al. | 372/96 |
| 7,149,235 | B2 * | 12/2006 | Tojo et al. | 372/50.12 |
| 7,369,593 | B2 | 5/2008 | Makita et al. | |
| 2003/0123512 | A1 * | 7/2003 | Johnson | 372/96 |
| 2003/0169794 | A1 * | 9/2003 | Hatano et al. | 372/45 |
| 2004/0028097 | A1 | 2/2004 | Miyabe et al. | |
| 2005/0230722 | A1 * | 10/2005 | Najda | 257/293 |
| 2006/0045161 | A1 * | 3/2006 | Kadoya | 372/71 |

FOREIGN PATENT DOCUMENTS

CN 1585219 A 2/2005

(Continued)

OTHER PUBLICATIONS

Chinese Office Action date Jan. 4, 2008 for corresponding Chinese Application No. 200610171904.6.

(Continued)

*Primary Examiner*—Minsun Harvey
*Assistant Examiner*—Michael Carter
(74) *Attorney, Agent, or Firm*—Rader, Fishman & Grauer PLLC; Christopher M. Tobin

(57) ABSTRACT

A laser diode device capable of detecting laser light with a simple structure is provided. A laser diode device, includes a semiconductor layer formed through laminating a first conductive type layer, an active layer and a second conductive type layer in this order, the second conductive type layer including a striped current confinement structure in a top portion thereof, and a plurality of electrodes being formed on the second conductive type layer side of the semiconductor layer and being electrically connected to the second conductive type layer at predetermined intervals, wherein the semiconductor layer has a photoreceptor region in a region corresponding to an electrode (a first electrode) of the plurality of electrodes except for at least one, the photoreceptor region absorbing a part of the light emitted in the semiconductor layer to convert the part of the light into a current signal.

6 Claims, 15 Drawing Sheets

FOREIGN PATENT DOCUMENTS

| | | |
|---|---|---|
| JP | 62-014479 A | 1/1987 |
| JP | 06-026815 A | 2/1994 |
| JP | 08-321657 A | 12/1996 |
| JP | 11-068236 | 3/1999 |
| JP | 11-121787 A | 4/1999 |
| JP | 11-307870 A | 11/1999 |
| JP | 2000-171671 A | 6/2000 |
| JP | 2000-261064 A | 12/2000 |
| JP | 2000-340877 A | 12/2000 |
| JP | 2001-36180 A | 2/2001 |
| JP | 2001-244570 A | 9/2001 |
| JP | 2002-319743 | 10/2002 |
| JP | 2004-007002 A | 1/2004 |
| JP | 2004-55744 A | 2/2004 |

OTHER PUBLICATIONS

Japanese Office Action issued Mar. 3, 2009 for corresponding Japanese Application No. 2005-268010.

Japanese Office Action issued Jun. 23, 2009 for corresponding Japanese Application No. 2005-268010.

Original Chinese Office Action issued Dec. 12, 2008 for corresponding Chinese Application No. 200610171904.6.

* cited by examiner

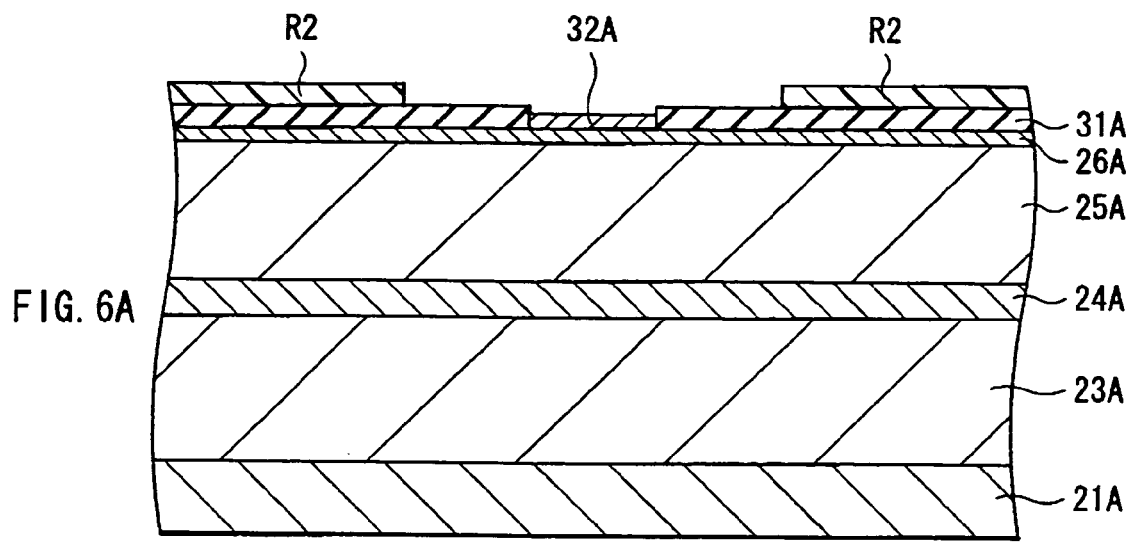
FIG. 6A
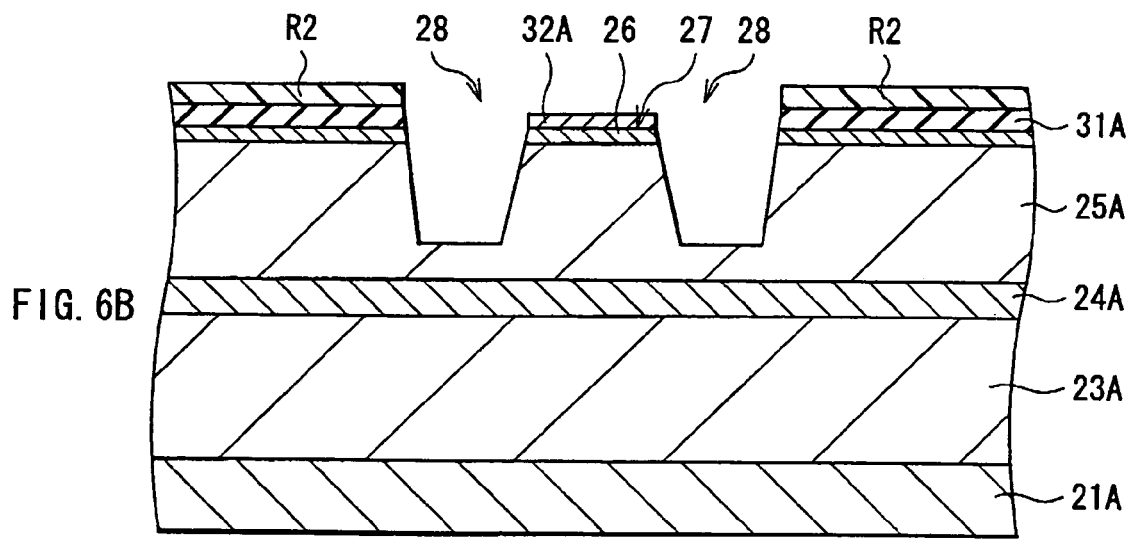
FIG. 6B
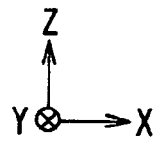

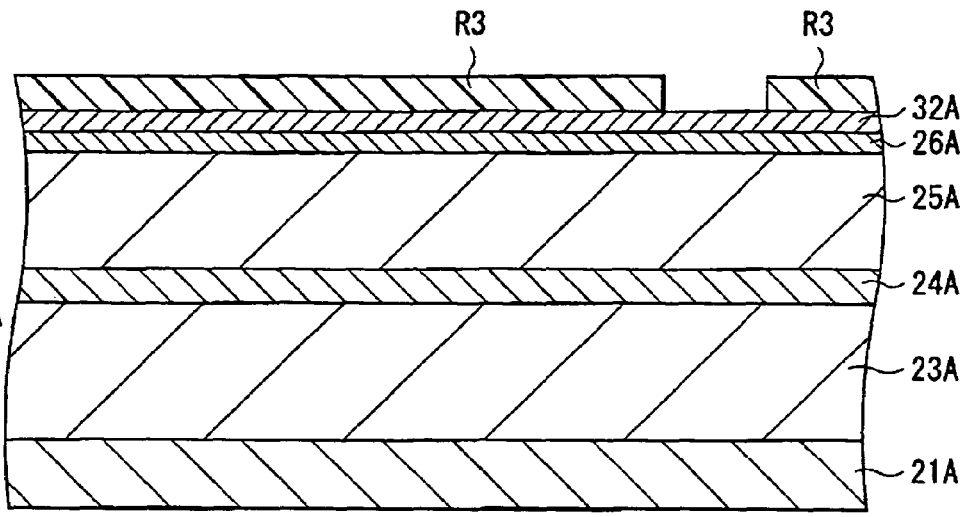
FIG. 7A
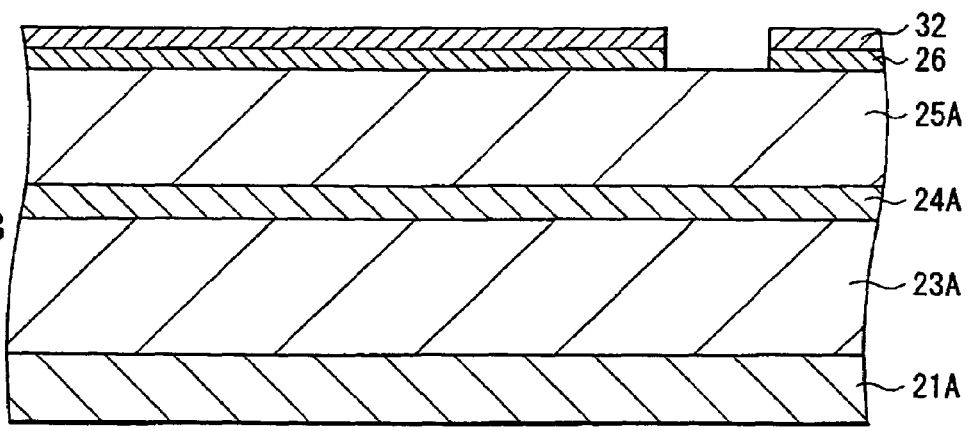
FIG. 7B
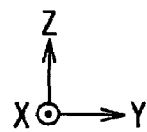

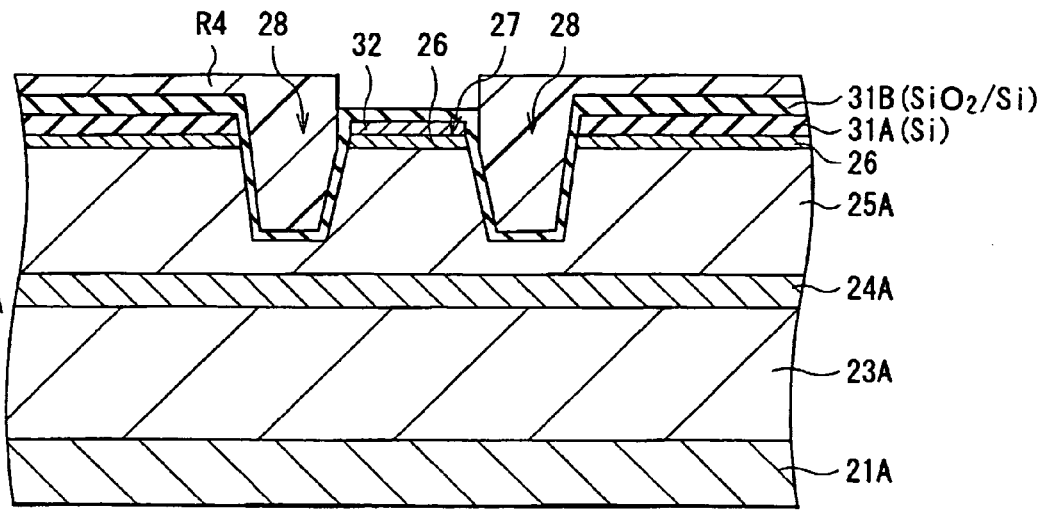
FIG. 8A
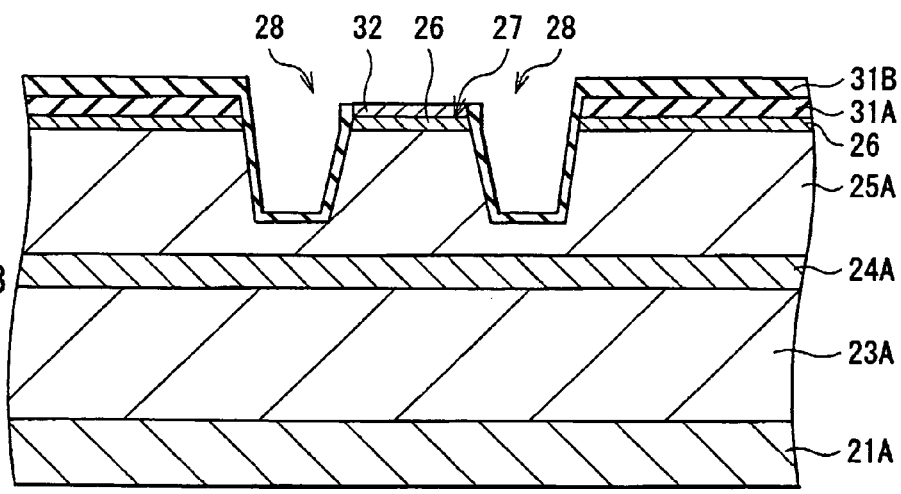
FIG. 8B
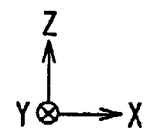

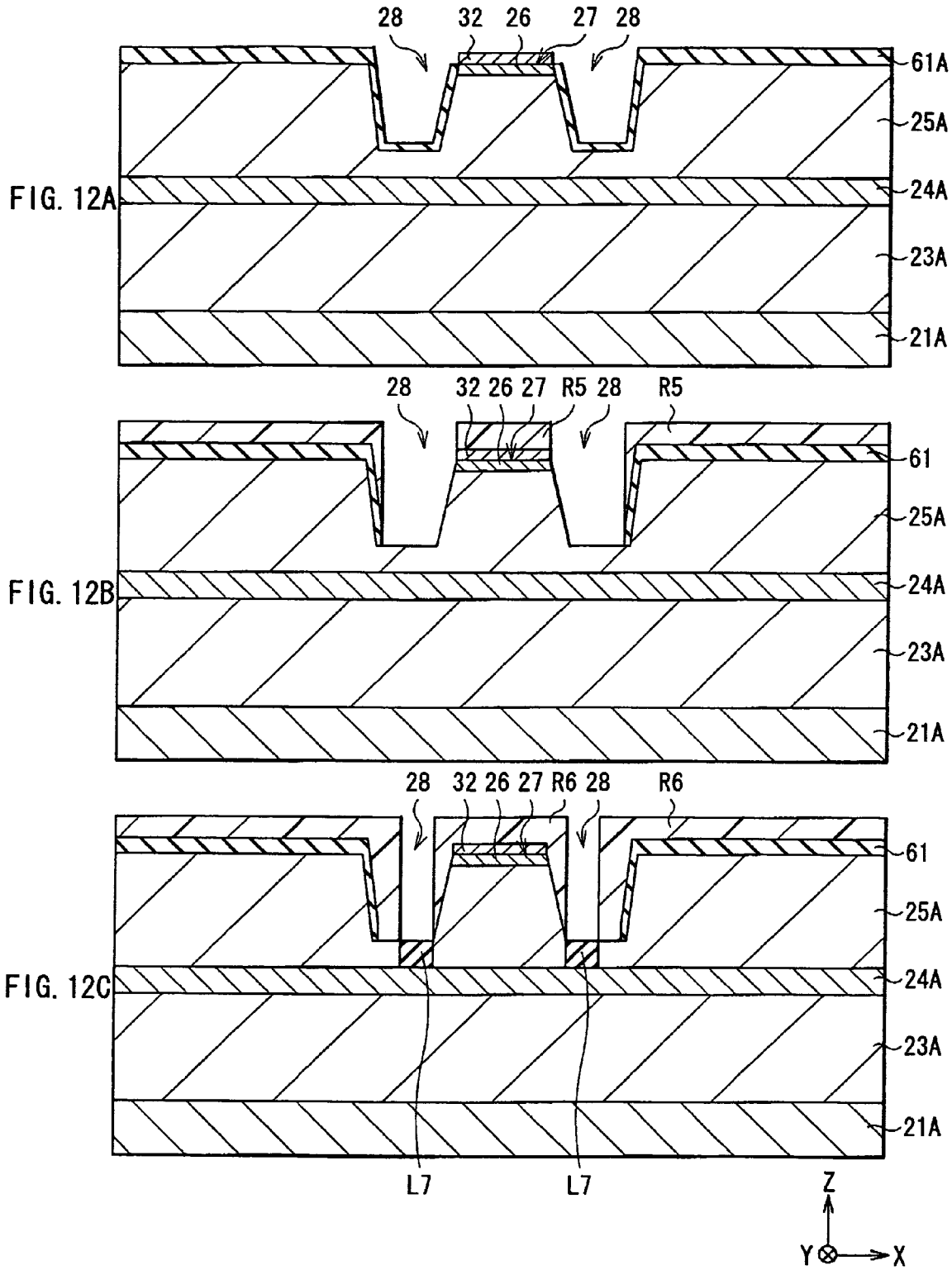

LASER DIODE DEVICE

CROSS REFERENCES TO RELATED APPLICATIONS

The present invention contains subject matter related to Japanese Patent Application JP 2005-268010 filed in the Japanese Patent Office on Sep. 15, 2005, the entire contents of which being incorporated herein by reference.

BACKGROUND OF THE INVENTION

1. Field of the Invention

The present invention relates to a laser diode device having a photodetector which detects laser light, more specifically to a laser diode device which can be suitably used for optical disks.

2. Description of the Related Art

A laser diode device for optical disks in a related art includes a photodetector which detects laser light from a laser diode included in the laser diode device. Typically, the photodetector is arranged in a region where the output of light from the laser does not decay, for example, on a rear end surface side of the laser diode (a side opposite to a light emission side) separate from the laser diode, and the photodetector detects laser light by absorbing light leaked through the rear end surface to convert the light into a current signal.

However, in general, the rear end surface of the laser diode is covered with a high-reflectivity film, so the output of light leaked through the rear end surface is extremely small. Therefore, it is necessary for the photodetector to have a high sensitivity to the leaked light. At present, as the laser diode for optical disks, a multiwavelength laser capable of outputting laser light of 780 nm wavelength used for replaying a CD (Compact Disk) or recording on or replaying a recordable optical disk, such as a CD-RW (CD Rewritable) or an MD (Mini Disk), or laser light of 650 nm wavelength used for recording on or replaying a DVD (Digital Versatile Disk) is the mainstream. Therefore, for example, as described in Japanese Unexamined Patent Application Publication No. 2004-55744, a photodiode (PD) made of a silicon (Si)-based compound semiconductor which can obtain high sensitivity to such long-wavelength light is used as a photodetector.

SUMMARY OF THE INVENTION

In recent years, a short-wavelength (405-nm wavelength) laser diode using a Group III-V nitride compound semiconductor (hereinafter referred to as nitride-based semiconductor) typified by GaN, AlGaN mixed crystal and GaInN mixed crystal has been achieved, and the short-wavelength laser diode has been developed for practical use as a light source for a higher-density optical disk. To use such a short-wavelength laser diode as the light source for the optical disk, a photodetector having high sensitivity to short-wavelength light is necessary.

However, the above-described photodiode has a low sensitivity to 405-nm wavelength light, so it is difficult to use the photodiode in the short-wavelength laser diode. However, if the output of light leaked from the rear end surface of the short-wavelength laser diode is increased by decreasing the reflectivity of the rear end surface, degradation of laser characteristics, such as an increase in a threshold current, a decline in the output of light from the laser, deterioration of relative intensity noise or a decline in reliability, arises. Moreover, instead of the above-described photodiode, a photodetector detecting short-wavelength light from the rear end surface side or a photodetector detecting a part of the light from an end surface on the light emission side can be arranged separately; however, when such a photodetector only for a short-wavelength laser diode is applied to, for example, a multi-wavelength laser diode device including a combination of a plurality of laser diodes, an issue that the laser diode device has a complicated structure arises.

In view of the foregoing, it is desirable to provide a laser diode device capable of detecting laser light with a simple structure.

According to an embodiment of the invention, there is provided a laser diode device including: a semiconductor layer formed through laminating a first conductive type layer, an active layer and a second conductive type layer in this order, the second conductive type layer including a striped current confinement structure in a top portion thereof, and a plurality of electrodes being formed on the second conductive type layer side of the semiconductor layer and being electrically connected to the second conductive type layer at predetermined intervals, wherein the semiconductor layer has a photoreceptor region in a region corresponding to an electrode (a first electrode) of the plurality of electrodes except for at least one, and the photoreceptor region absorbing a part of the light emitted in the semiconductor layer to convert the part of the light into a current signal.

In the laser diode device according to the embodiment of the invention, a part of the emitted light is absorbed in a region (a photoreceptor region) corresponding to the first electrode of the semiconductor layer and is converted into a current signal. The magnitude of the current signal has a certain correlation with the magnitude of the output of laser light to be emitted, so, for example, when the current signal is inputted into a light output arithmetic circuit as a light output monitor signal, the magnitude of the output of the emitted laser light can be calculated by the light output arithmetic circuit. In other words, the laser diode device according to the embodiment of the invention includes a laser diode including a photodetector in a photoreceptor region, so it is not necessary to arrange a photodetector separately from the laser diode.

In the laser diode device according to the embodiment of the invention, the photoreceptor region is disposed in a region corresponding to the first electrode, and it absorbs a part of the light emitted in the semiconductor layer to convert the part of the light into a current signal, so a current signal having a correlation with the magnitude of the output of laser light to be emitted can be drawn, and thereby it is not necessary to arrange a photodetector, such as a photodiode, separately from the photodetector. Therefore, the laser diode device with a simple structure can detect laser light.

Other and further objects, features and advantages of the invention will appear more fully from the following description.

BRIEF DESCRIPTION OF THE DRAWINGS

FIGS. 6A and 6B are sectional views showing steps following FIGS. 5A, 5B and 5C;

FIGS. 7A and 7B are sectional views showing steps following FIGS. 6A and 6B;

FIGS. 8A and 8B are sectional views showing steps following FIGS. 7A and 7B;

FIGS. 12A, 12B and 12C are sectional views for describing steps of manufacturing the laser diode device shown in FIG. 10;

DETAILED DESCRIPTION OF THE PREFERRED EMBODIMENTS

Preferred embodiments will be described in detail below by referring to the accompanying drawings.

First Embodiment

Figure 1:
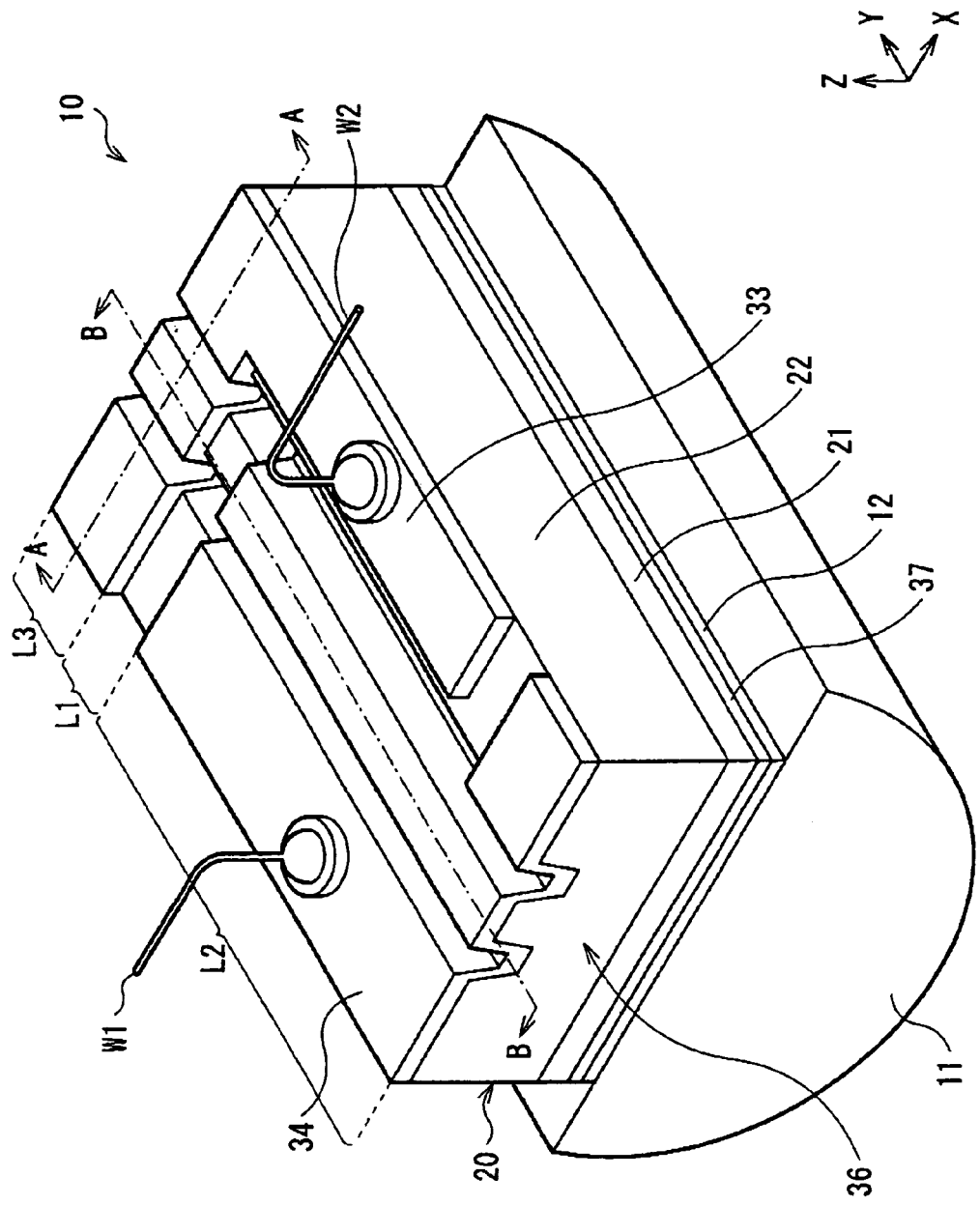
FIG. 1 is a perspective view of the structure of a laser diode according to a first embodiment of the invention.
Figure 2:
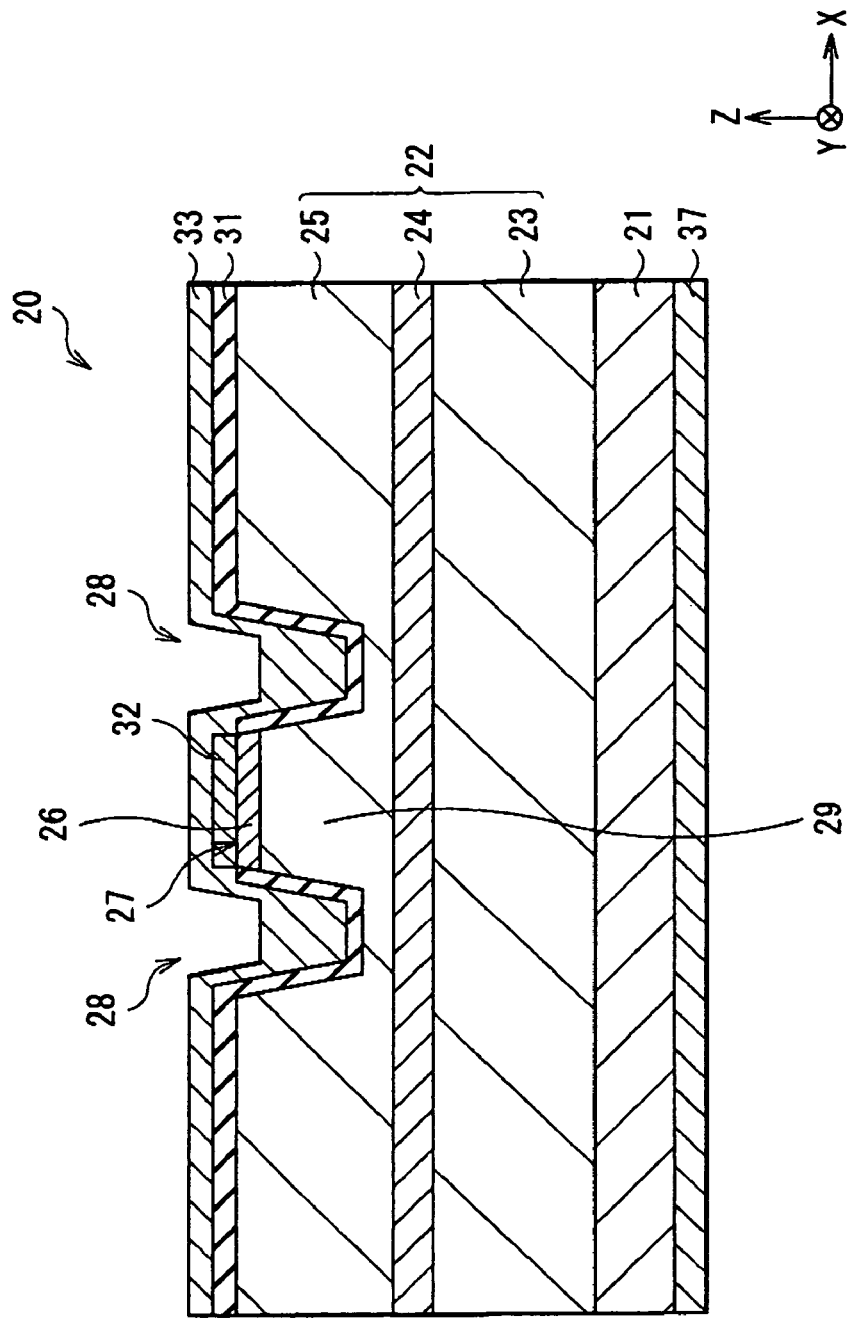
FIG. 2 is a sectional view taken along a line A-A of FIG. 1.
Figure 3:
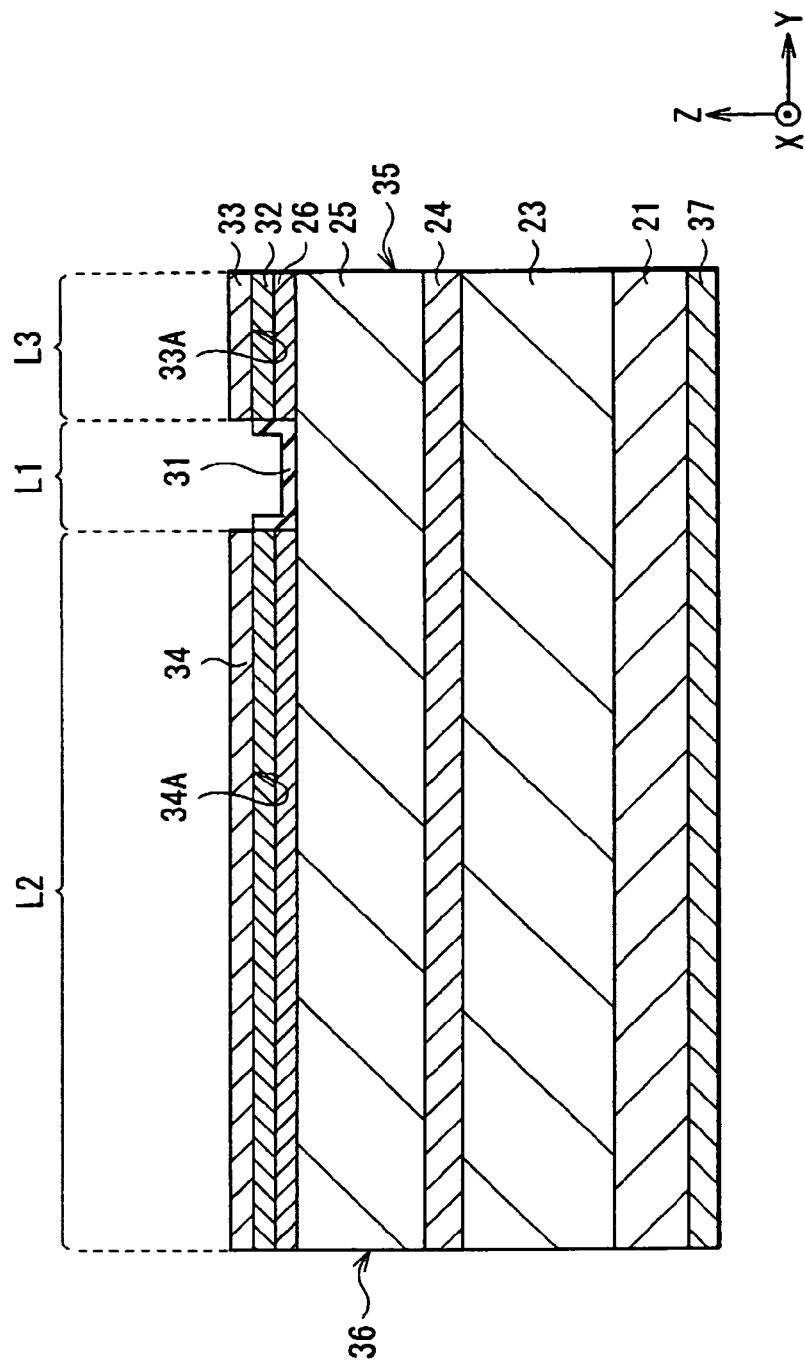
FIG. 3 is a sectional view taken along a line B-B of FIG. 1.

FIG. 1 shows the structure of a laser diode device 10 according to a first embodiment of the invention. FIG. 2 shows a sectional view taken along an arrow A-A of FIG. 1, and FIG. 3 shows a sectional view taken along an arrow B-B of FIG. 1. FIGS. 1 through 3 are schematic views, so the dimensions and the shapes in FIGS. 1 through 3 are different from the actual dimensions and shapes.

The laser diode device 10 includes a laser diode 20 on a heat sink 11 (a heat radiation section) with a bonding layer 12 in between so as to face the p-side of the laser diode 20 up. The heat sink 11 is made of, for example, a material having electrical and thermal conductivity, such as Cu (copper). The bonding layer 12 fixes the laser diode device 10 and the heat sink 11, and is made of, for example, a bonding material including AuSn or the like. Thereby, heat emitted from the laser diode 20 is dissipated via the heat sink 11, so the laser diode 20 is maintained at an appropriate temperature.

The laser diode 20 is formed through growing a semiconductor layer 22 made of a Group III-V nitride semiconductor on a substrate 21 made of n-type GaN (gallium nitride). The semiconductor layer 22 has a laser structure formed through laminating an n-type cladding layer 23, an active layer 24, a p-type cladding layer 25 and a p-type contact layer 26 in this order. In this case, the n-type cladding layer 23 corresponds to "a first conductive type layer" in the invention, and the p-type cladding layer 25 and the p-type contact layer 26 correspond to "a second conductive type layer" in the invention. Hereinafter, a direction where the above semiconductor layers are laminated is called a vertical direction; a direction where laser light is emitted is called an axial direction; and a direction perpendicular to the axial direction and the vertical direction is called a lateral direction.

The Group III-V nitride semiconductor in this case is a gallium nitride-based compound including gallium (Ga) and nitrogen (N), and examples of the Group III-V nitride semiconductor include GaN, AlGaN (aluminum.gallium nitride), AlGaInN (aluminum.gallium.indium nitride) and so on. They include an n-type impurity of a Group IV or VI element, such as Si (silicon), Ge (germanium), O (oxygen) or Se (selenium), or a p-type impurity of a Group II or IV element such as Mg (magnesium) Zn (zinc) or C (carbon), if necessary.

In the semiconductor layer 22, the n-type cladding layer 23 is made of, for example, n-type AlGaN. The active layer 24 has, for example, an undoped GaInN multiquantum well structure. The p-type cladding layer 25 is made of, for example, AlGaN, and the p-type contact layer 26 is made of, for example, p-type GaN.

In a part of the p-type cladding layer 25 and the p-type contact layer 26, a stripe-shaped ridge (a projected rim portion) 27 extending in the axial direction and grooves 28 disposed on both sides of the ridge 27 are formed through selective etching after forming the p-type contact layer 26, as will be described later. The p-type contact layer 26 is formed only on the top of the ridge 27. A stripe-shaped structure including the ridge 27 and the grooves 28 is a so-called W ridge structure, and it has a function of limiting the size of a current path 29 in the semiconductor layer 22 and a function of stably maintaining a light mode in the lateral direction into a standard (0th) mode and guiding the light mode to the axial direction. The W ridge structure corresponds to "a current confinement structure" in the invention.

The W ridge structure in which the grooves 28 are formed on both sides of the ridge 27 is used, because when the p-type cladding layer 25 is deeply etched over a wide range instead of arranging the groove 28, electrical leakage easily occurs, and manufacturability is impaired. Moreover, in general, the Group III-V nitride semiconductor is a material that is difficult to be uniformly etched over a wide range, so the ridge 27 is formed through etching in as narrow a range as possible.

An insulating film 31 is formed on a surface of the p-type cladding layer 25 including both side surfaces of the ridge 27 and the inner surfaces of the grooves 28. In other words, the insulating film 31 has an opening in a region corresponding to the top surface the ridge 27. The insulating film 31 has, for example, a structure in which $SiO_2$ and Si are laminated in this order.

A p-side contact electrode 32 is formed on the top surface of the ridge 27 (a surface of the p-type contact layer 26). In this case, the p-side contact electrode 32 includes, for example, Pd (palladium).

Moreover, a p-side electrode 33 (a first electrode) and a p-side electrode 34 (a second electrode) are formed on surfaces of the insulating film 31 and the p-side contact electrode 32 with a separation region L1 in between. In this case, each of the p-side electrode 33 and the p-side electrode 34 has a structure in which Ti (titanium), Pt (platinum) and Au (gold) are laminated in this order.

The separation region L1 is a strip-shaped region extending in the lateral direction, and it is formed so as to spatially separate the p-side electrode 33 and the p-side electrode 34 from each other in the axial direction and not to electrically short-circuit them. It is preferable to isolate the p-side electrode 33 and the p-side electrode 34 from each other by 100Ω or over more. In the embodiment, the separation region L1 is formed through removing the p-type contact layer 26 and the p-side contact electrode 32 on the top of the ridge 27 to expose the p-type cladding layer 25, and covering the surface of the p-type cladding layer 25 with the insulating film 31. For example, when the resistivity of the p-type cladding layer 25 is 1 Ω·cm, and the cross-sectional area of the p-type cladding layer 25 in the separation region L1 is 0.75 μm$^2$ (=1.5 μm (width)×0.5 μm (depth)), it is obvious that in order to have 100Ω or over between the p-side electrode 33 and the p-side electrode 34, it is only necessary for the width of the separation region L1 in the axial direction to be 0.0075 μm (=100Ω× 0.75 μm²/1 Ω·cm) or over.

In addition, at least one kind of impurity selected from the group consisting of silicon (Si), oxygen (O), aluminum (Al) and boron (B) may be injected into the separation region L1. Thereby, the resistivity in the p-type cladding layer 25 in the separation region L1 becomes larger, so the p-side electrode 33 and the p-side electrode 34 can be isolated from each other reliably.

The p-side electrode 34 has a structure in which Ti (titanium), Pt (platinum) and Au (gold) are laminated in this order. The p-side electrode 34 is formed on surfaces of the insulating film 31 and the p-side contact electrode 32 on a side closer to a reflection side end surface 36, which will be described later, from the separation region L1 as a base, and is electrically connected to the p-type contact layer 26 of the ridge 27 via the p-side contact electrode 32. Hereinafter, a portion that is electrically connected to the p-type contact layer 26 of the ridge 27 in the p-side electrode 34 is called a contact portion 34A. The p-side electrode 34 is also bonded to a wire W1 made of gold and electrically connected to an external power source (not shown) via the wire W1.

Thereby, the p-side electrode 34 can inject a current into the active layer 24 via the contact portion 34A, so a region corresponding to the contact portion 34A of the active layer 24 has a function as a so-called gain region L2. In this case, "a function as a gain region L2" means a function of amplifying light emitted from an injected carrier.

As in the case of the p-side electrode 34, the p-side electrode 33 has a structure in which Ti (titanium), Pt (platinum) and Au (gold) are laminated in this order. The p-side electrode 33 is formed on a surface including the surfaces of the insulating film 31 and the p-side contact electrode 32 on a side closer to an emission side end surface 35, which will be described later, from the separation region L1 as a base. Hereinafter, a portion that is electrically connected to the p-type contact layer 26 of the ridge 27 in the p-side electrode 33 is called a contact portion 33A. The p-side electrode 33 is also bonded to a wire W2 made of gold or the like and electrically connected to a light output arithmetic circuit (not shown) via the wire W2.

Thereby, the p-side electrode 33 can draw a current (photocurrent) from the active layer 24 via the contact portion 33A and input the current from the active layer 24 into the light output arithmetic circuit, so a region corresponding to the contact portion 33A of the active layer 24 has a function as a so-called photoreceptor region L3. In this case, "a function as a photoreceptor region L3" means a function of absorbing light emitted from the gain region L2 to convert the light into a current signal and is, for example, the same function as that of a photodetector such as a photodiode. Therefore, the laser diode 20 includes a photodetector in the photoreceptor region L3, so it is not necessary to arrange a photodetector separately from the laser diode 20.

The photodetector included in the photoreceptor region L3 only absorbs a part of the light emitted in the semiconductor layer 22 to convert the part of the light into a current signal, so there is little possibility of degrading the laser characteristics. Moreover, an interaction between the gain region L3 and the photoreceptor L3 may cause self-oscillation (pulsation).

The above-described light output arithmetic circuit receives the current signal from the p-side electrode 33 as a light output monitor signal and determines the magnitude of the output of laser light to be emitted through the use of the following formula. The formula represents a relationship between emission power Pout and internal photon density S, and the magnitude of the internal photon density S has a close correlation with the magnitude of the above-described light output monitor signal, so the magnitude of the emission power Pout corresponds one-to-one with the magnitude of the light output monitor signal.

$$Pout = (1/2) \times (C_0/n_{eq}) \times hv \times \ln(1/(RfRf)) \times wd \times \{(1-Rf)/((1-Rf)+(1-Rr))\} \times S \quad (1)$$

In the formula, $C_0$ is the speed of light; $n_{eq}$ is the transmission refractive index of the active layer 24; hv is the band gap energy of the active layer 24; W is the width of the ridge 27 in the axial direction; d is the thickness of the active layer 24 in the vertical direction, and Rr is the refractive index on a rear end surface side.

It is necessary for the contact portion 33A to have an area in which a current amount detectable by the above-described light output arithmetic circuit (a detectable current amount) can be generated. Therefore, the length of the contact portion 33A in the axial direction is much shorter than the length of the contact portion 34A in the axial direction (for example, 380 μm), and is, for example, approximately 10 μm.

Figure 4:
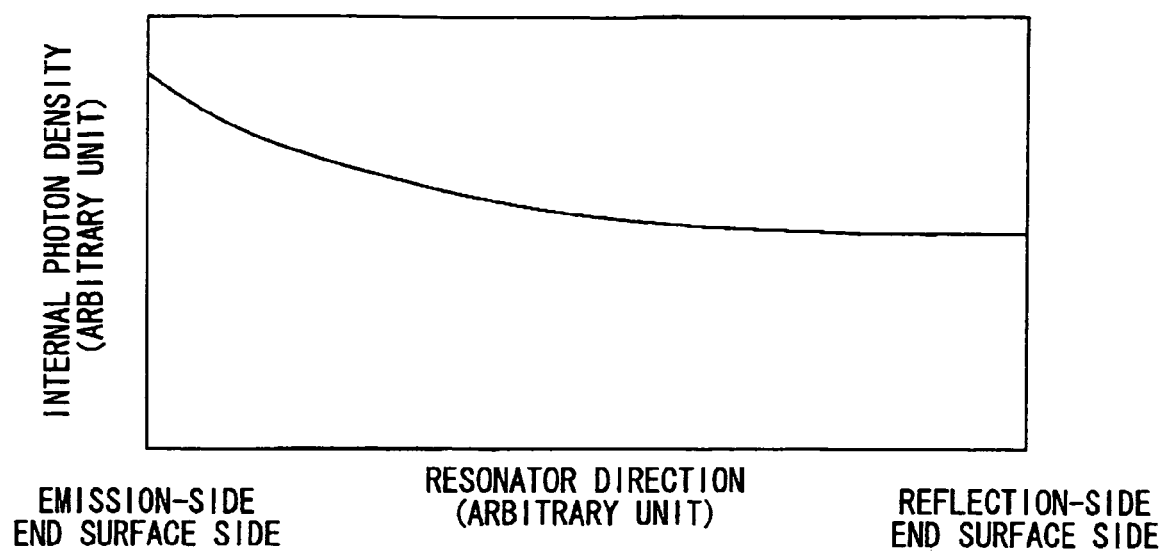
FIG. 4 is a plot showing a relationship between a resonator direction and internal photon density.

Moreover, it is only necessary for the contact portion 33A to be disposed in a region sandwiched by a resonator including an emission-side end surface 35 and a reflection-side end surface 36, which will be described later, so the contact portion 33A may be formed so as to correspond to any part of the top portion of the ridge 27; however, the contact portion 33A is preferably formed so as to correspond to a part of the top portion of the ridge 27 on the emission-side end surface 35 side. It is because, as shown in FIG. 4, the internal photon density S is at its maximum in proximity to the emission-side end surface 35, so a sufficient current amount can be secured without excessively increasing the area of the contact portion 33A. Further, in the photoreceptor region L3, very little heat is generated, so in the case where the photoreceptor region L3 is disposed on the emission-side end surface 35 side, the degradation of the emission-side end surface 35 can be prevented without arranging a heat radiation mechanism near the emission-side end surface 35.

A pair of the emission-side end surface 35 and the reflection-side end surface 36 are formed on side surfaces perpendicular to the extending direction (axial direction) of the ridge 27. The emission-side end surface 35 is made of, for example, $Al_2O_3$ (aluminum oxide), and is adjusted so as to have low reflectivity. On the other hand, the reflection-side end surface 36 is formed, for example, through alternately laminating an aluminum oxide layer and a titanium oxide layer, and is adjusted so as to have high reflectivity. Thereby, light generated in the gain region of the active layer 24 travels between the pair of the emission-side end surface 35 and the reflection-side end surface 36 so as to be amplified, and then is emitted from the emission-side end surface 35 as a beam.

On the other hand, an n-side electrode 37 is disposed on the whole back surface of the substrate 21, and is electrically connected to the substrate 21 and the n-type cladding layer 23. The n-side electrode 37 has, for example, a structure in which Ti, Pt and Au are laminated in this order. The n-side electrode 37 is electrically connected to the heat sink 11 when the laser diode 20 is mounted on the heat sink 11, so the n-side electrode 37 has the same potential (zero volts) as a ground (not shown) electrically connected to the heat sink 11.

The laser diode device 10 can be manufactured by the following steps.

FIGS. 5A through 9 show steps of the manufacturing method in order. To manufacture the laser diode 20, a semiconductor layer 22A made of a Group III-V nitride (GaN-based compound semiconductor) is formed on a substrate 21A made of GaN by, for example, a MOCVD (Metal Organic Chemical Vapor Deposition) method. At this time, as the materials of the GaN-based compound semiconductor, for example, trimethylaluminum (TMA), trimethylgallium (TMG), trimethylindium (TMIn) and ammonia ($NH_3$) are used, and as the material of a donor impurity, for example, monosilane ($SiH_4$) is used, and as the material of an acceptor impurity, for example, cyclopentadienyl magnesium (CPMg) is used.

Figure 5A:
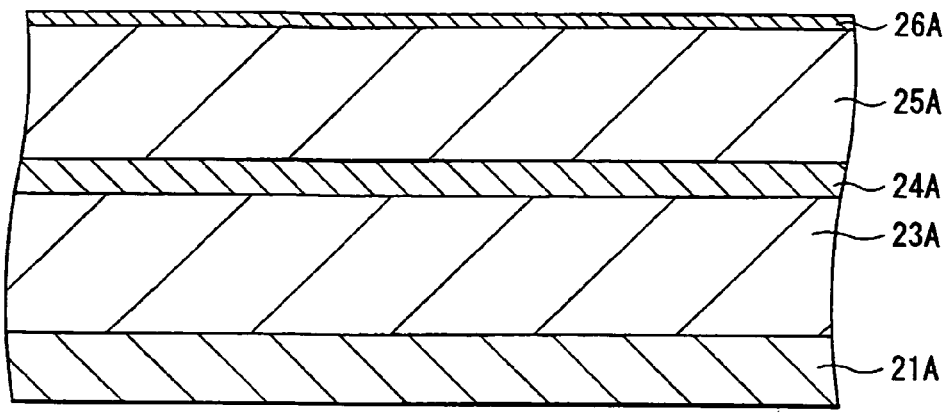
FIGS. 5A, 5B and 5C are sectional views for describing steps of manufacturing the laser diode shown in FIG. 1.
Figure 5B:
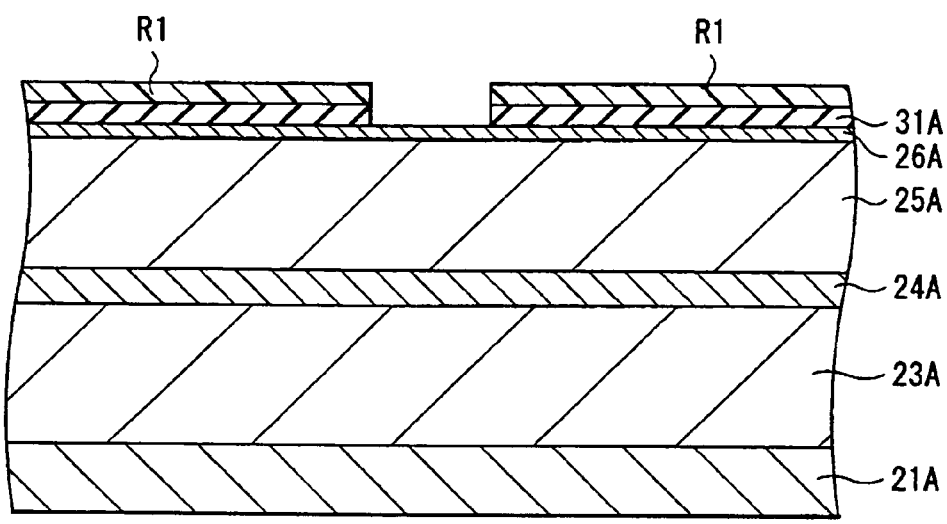
Figure 5C:
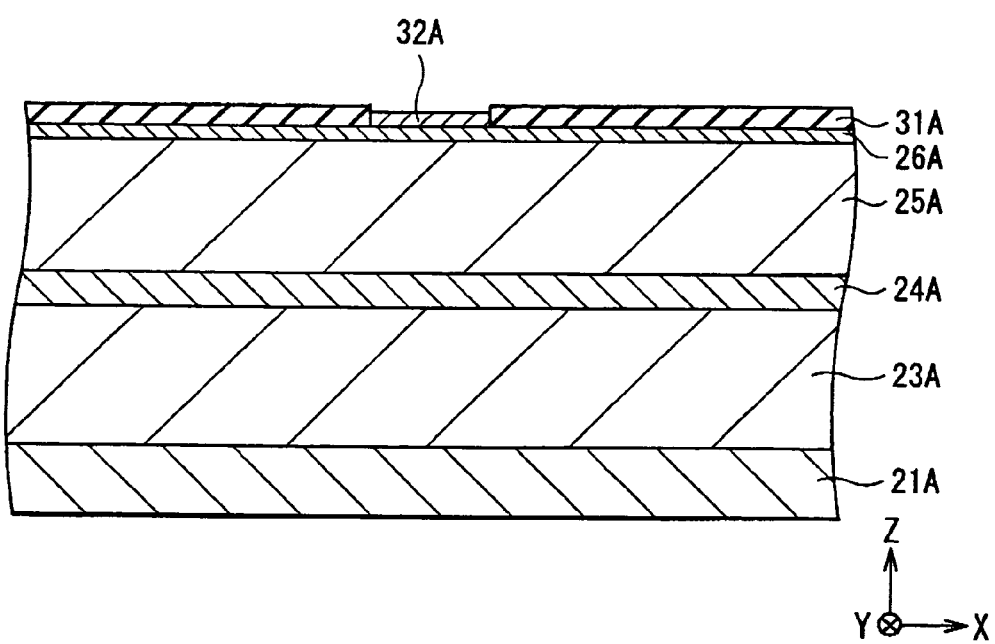
Figure 9:
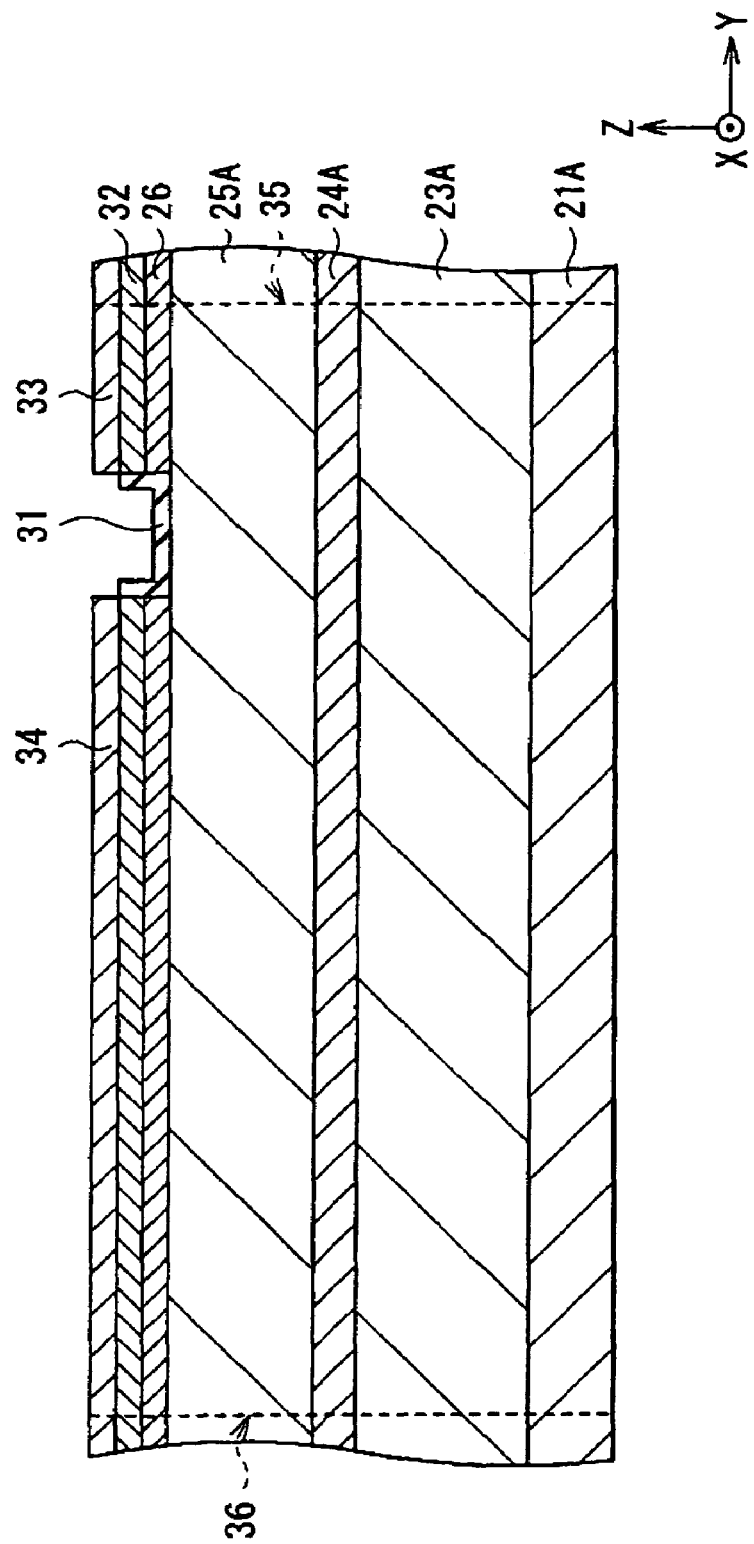
FIG. 9 is a sectional view showing a step following FIGS. 8A and 8B.

More specifically, at first, an n-type cladding layer 23A, an active layer 24A, a p-type cladding layer 25A and a p-type contact layer 26A are laminated in this order on the substrate 21A (refer to FIG. 5A).

Next, an insulating film 31A made of $SiO_2$ with a thickness of 0.2 μm is formed on the p-type contact layer 26A. Then, a film made of a photoresist is formed on the insulating film 31A, and a photoresist layer R1 having a stripe-shaped opening which extends in the axial direction is formed by a photolithography technique. Next, the insulating film 31A is selectively removed by a wet etching method using a hydrofluoric acid-based etching solution through the use of the photoresist layer R1 as a mask (refer to FIG. 5B). After that, a metal layer including Pd with a thickness of 100 nm is formed by a vacuum evaporation method. After that, the photoresist layer R1 is removed. Thereby, a p-side contact electrode 32A is formed (refer to FIG. 5C).

Next, a film made of a photoresist is formed on the p-side contact electrode 32A and the insulating film 31A, and a photoresist layer R2 having an opening in a region where the W ridge structure will be formed is formed by the photolithography technique (refer to FIG. 6A). Next, the insulating film 31A is selectively removed by a wet etching method using a hydrofluoric acid-based etching solution through the use of the photoresist layer R2 and the p-side contact electrode 32A as masks. Next, a part of the p-type contact layer 26A and a part of the p-type cladding layer 25A are selectively removed by a dry etching method using a chlorine-based etching gas (refer to FIG. 6B). After that, the photoresist layer R2 is removed, and a part not covered with the p-side contact electrode 32A of the p-type contact layer 26A is removed. Thereby, the W ridge structure including the stripe-shaped ridge 27 and the grooves 28 is formed in the top portion of the semiconductor layer 22A.

Next, a film made of a photoresist is formed on the whole surface so as to form a photoresist layer R3 having an opening, in a region corresponding to the separation region L1 by the photolithography technique (refer to FIG. 7A). Next, the p-side contact electrode 32A is selectively removed by an ion milling method through the use of the photoresist layer R3 as a mask so as to expose the top surface of the p-type contact layer 26A, and then the p-type contact layer 26A is selectively removed by a dry etching method using a chlorine-based etching gas. After that, the photoresist layer R3 is removed. Thereby, a region which will be the separation region L1 is formed, and the p-type contact layer 26 and the p-side contact electrode 32 are formed on the top surface except for a portion which will be the separation region L1 (refer to FIG. 7B).

Next, an insulating layer 31B made of $SiO_2$ with a thickness of 0.2 μm is formed on the whole surface. Then, a film made of a photoresist is formed so that a part of the film on the top of the p-side contact electrode 32 is thinner, and the other part of the film is thicker, that is, the whole surface becomes flat, and then, a photoresist layer R4 having an opening in a region corresponding to the top surface of the p-side contact electrode 32 is formed by the photolithography technique (refer to FIG. 8A). Next, the insulating layer 31B on the p-side contact electrode 32 is etched through the use of the p-side contact electrode 32 as an etching stop layer, and thereby the p-side contact electrode 32 is exposed (refer to FIG. 8B).

Next, a film made of a photoresist is formed on the whole surface, and a photoresist layer (not shown) is formed in a region corresponding to the separation region L1 by the photolithography technique. Next, for example, Ti, Pt and Au are laminated in this order through the use of an evaporator. After that, the photoresist layer is removed. Thereby, the p-side electrode 33 and the p-side electrode 34 are formed on the emission-side end surface 35 and the reflection-side end surface 36, respectively (refer to FIG. 9).

Next, the back surface of the substrate 21A is polished as necessary, and Ti, Pt and Au are laminated in this order on the back surface. Thereby, the n-side electrode 37 is formed. Further, the substrate 21A is diced into each element (each laser diode 20). Thus, the laser diode 20 is formed. Further, the wire W is connected to the p-side electrode 34 and the heat sink 11 is bonded to the n-side electrode 37 via the bonding layer 12, and thereby the laser diode device 10 is manufactured (refer to FIG. 1).

In the laser diode 20, when a voltage having a predetermined potential difference is applied between the p-side electrode 34 and the n-side electrode 37, a current confined by the ridge 27 is injected into the gain region L2 (a light emission region) of the active layer 24, and thereby light emission by electron-hole recombination occurs. The light is reflected by a pair of reflecting mirrors, and causes laser oscillation with a wavelength with a round-trip phase shift of an integral multiple of $2\pi$, and the light is outputted to the outside as a beam.

At this time, the p-side electrode 33 is electrically connected to the light output arithmetic circuit via the wire W2, so light emitted in the gain region L2 is absorbed in the photoreceptor region L3 corresponding to p-side electrode 33 of the active layer 24 so as to be converted into a current signal (photocurrent). The current signal is outputted to the light output arithmetic circuit via the wire W2. The current signal from the p-side electrode 33 is received in the light output arithmetic circuit as a light output monitor signal, and the magnitude of the output of laser light to be emitted is calculated by the above-described formula (1). As described above, the laser diode 20 includes the photodetector in the photoreceptor region L3, so it is not necessary to arrange the photodetector separately from the laser diode 20.

Thus, in the laser diode device according to the embodiment, the photoreceptor region L3 is arranged in a region corresponding to the p-side electrode 33, and the photoreceptor region L3 absorbs a part of the light emitted in the semiconductor layer 22 to convert the part of the light into a light output monitor signal, so a current signal having a correlation with the magnitude of the output of laser light to be emitted can be drawn, and it is not necessary to arrange a photodetector, such as a photodiode, separately from the laser diode 20. Thereby, the laser diode device with a simple structure can detect laser light.

Second Embodiment

Figure 10:
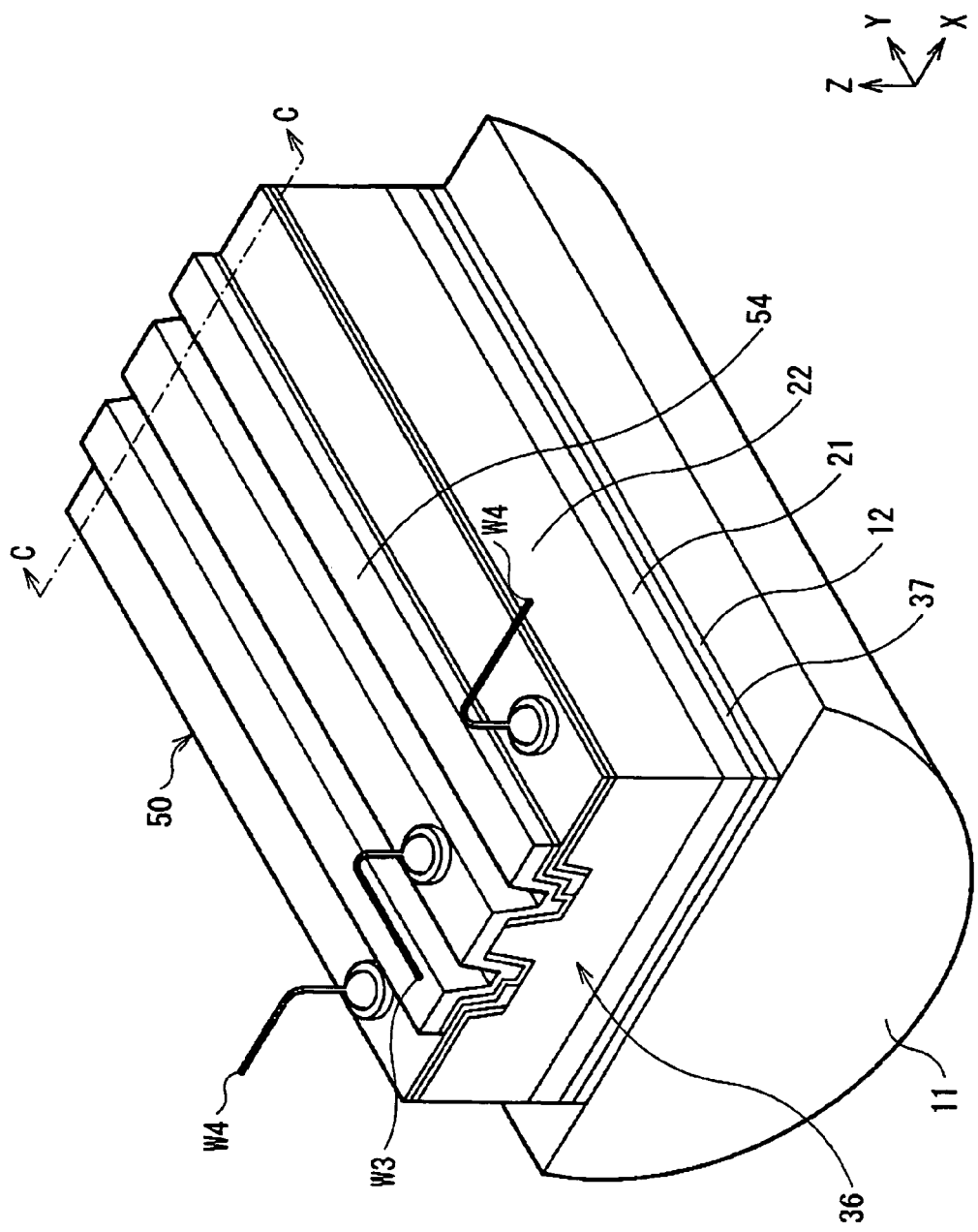
FIG. 10 is a perspective view of the structure of a laser diode device according to a second embodiment of the invention.
Figure 11:
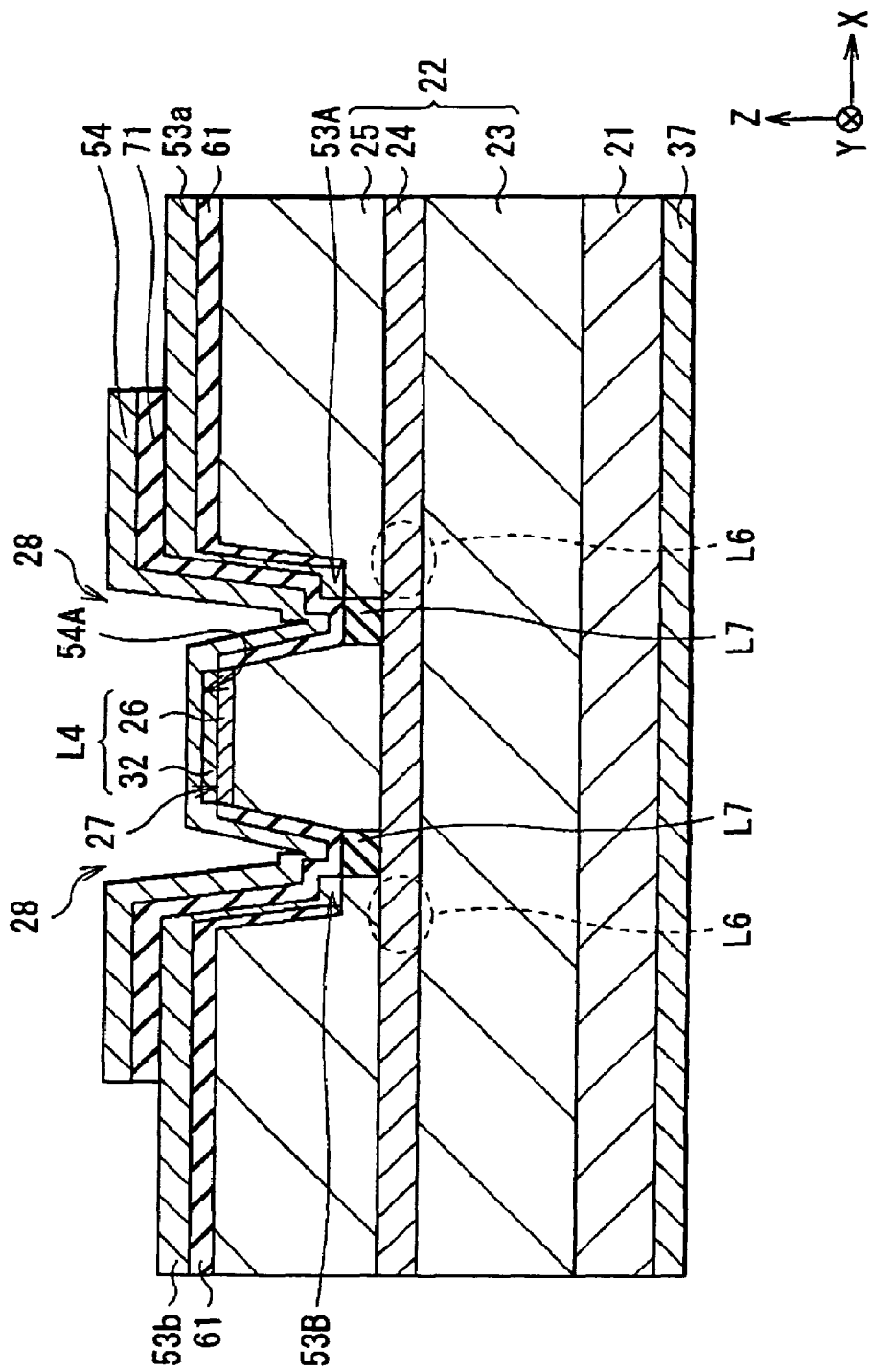
FIG. 11 is a sectional view taken along a line C-C of FIG. 11.

FIG. 10 shows the structure of a laser diode device according to a second embodiment of the invention. FIG. 11 shows a sectional view taken along an arrow C-C of FIG. 10. FIGS. 10 and 11 are schematic views, and the dimensions and shapes in FIGS. 10 and 11 are different from the actual dimensions and shapes.

The laser diode device according to the second embodiment includes a laser diode 50 on the heat sink 11 (a heat radiation section) with the bonding layer 12 in between so as to face the p-side of the laser diode 50 up. The laser diode 50 is distinguished from the laser diode 20 including the photoreceptor region L3 in a part of a region corresponding to a predetermined region of the ridge 27 by the fact that the laser diode 50 includes a photoreceptor region L6 in a region corresponding to a part (a stripe-shaped region) of the groove 28. Therefore, the above difference will be mainly described in detail, and the same structures, functions and effects as those in the first embodiment will not be described.

An insulating film 61 is formed on side surfaces (except for side surfaces on the ridge 27 side) of the groove 28 and the surface of a region, except for the groove 28 of the p-type cladding layer 25. In other words, the insulating film 61 has openings in a region corresponding to the ridge 27 and a region corresponding to the bottom surface of the groove 28. The insulating film 61 has, for example, a structure in which $SiO_2$ and Si are laminated in this order.

P-side electrodes 53 (53a and 53b) are formed on a part (the p-type cladding layer 25) of the bottom surface of the groove 28 and the surface of the insulating film 61. The p-side electrodes 53 (53a and 53b) have a structure in which Ti (titanium), Pt (platinum) and Au (gold) are laminated in this order. The p-side electrode 53a is formed on one side from the ridge 27 as a base, and the p-side electrode 53b is formed on the other side from the ridge 27 as a base. Thereby, the p-side electrodes 53 (53a and 53b) are electrically connected to a part (the p-type cladding layer 25) of the bottom surface of the groove 28. Hereinafter a portion electrically connected to the p-type cladding layer 25 of the groove 28 in the p-side electrode 53a is called a contact portion 53A, and a portion electrically connected to the p-type cladding layer 25 of the groove 28 in the p-side electrode 53b is called a contact portion 53B. The p-side electrodes 53 (53a and 53b) are bonded to a wire W3 made of gold or the like, and they are electrically connected to the same light output arithmetic circuit (not shown) as that in the first embodiment via the wire W4.

Thereby, the p-side electrodes 53 (53a and 53b) draw a current (photocurrent) from the active layer 24 via the contact portions 53A and 53B, and they can input the current from the active layer 24 into the light output arithmetic circuit, so regions corresponding to the contact portions 53A and 53B of the active layer 24 have a function as a so-called photoreceptor region L6. In this case, "a function as a photoreceptor region L6" means a function of absorbing light emitted in a gain region L4, which will be described later, to convert the light into a current signal, and is, for example, the same function as that of a photodetector such as a photodiode. Therefore, the laser diode 50 includes a photodetector in the photoreceptor region L6, so it is not necessary to arrange a photodetector separately from the laser diode 50.

It is necessary for the contact portions 53A and 53B to have an area in which a current amount detectable by the above-described light output arithmetic circuit (a detectable current amount) can be generated. Moreover, it is only necessary for the contact portions 53A and 53B to be disposed in a region sandwiched by a resonator including the emission-side end surface 35 and the reflection-side end surface 36, so the contact portions 53A and 53B may be formed so as to correspond to any part of the bottom surface of the groove 28; however, the contact portions 53A and 53B are preferably formed so as to correspond to a region including a region on the emission-side end surface 35 side of the bottom surface of the groove 28. It is because, as shown in FIG. 4, the internal photon density S is at its maximum in proximity to the emission-side end surface 35 so that a sufficient current amount can be secured without excessively increasing the areas of the contact portions 53A and 53B.

The photodetector arranged in the photoreceptor region L6 only absorbs a part of the light emitted in the semiconductor layer 22 to convert the part of the light into a current signal, so there is little possibility of degrading the laser characteristics. Moreover, an interaction between the gain region L4 and the photoreceptor region L6 may cause self-oscillation (pulsation).

An insulating film 71 is formed on both side surfaces of the ridge 27, a part (a portion corresponding to a region between the sides of the ridge 27 and the p-side electrodes 53 (53a and 53b) of the p-type cladding layer 25) of the bottom surface of the groove 28 and the surfaces of the p-side electrodes 53 (53a and 53b). In other words, the insulating film 71 has an opening in a region corresponding to the top surface of the ridge 27 (the p-side contact electrode 32). The insulating film 71 has, for example, a structure in which $SiO_2$ and Si are laminated in this order.

A p-side electrode 54 (a first electrode) is formed on each of the surfaces of the p-side contact electrode 32 and the insulating film 71. The p-side electrode 54 has a structure in which Ti (titanium), Pt (platinum) and Au (gold) are laminated in this order, and it is electrically connected to the p-type contact layer 26 of the ridge 27 via the p-side contact electrode 32. Hereinafter a portion that is electrically connected to the p-type contact layer of the ridge 27 in the p-side electrode 54 is called a contact portion 54A. The p-side electrode 54 is bonded to a wire W3 made of gold or the like, and is electrically connected to an external power source (not shown) via the wire W3.

Thereby, the p-side electrode 54 can inject a current into the active layer 24 via the contact portion 54A, so a region corresponding to the contact portion 54A of the active layer 24 has a function as a so-called gain region L4. In this case, "a function as a gain region L4" means a function of amplifying the light emitted by an injected carrier.

A high resistance region L7 is formed in a portion corresponding to a part of the groove 28 (a region between the sides of the ridge 27 and the p-side electrodes 53 (53a and 53b)) of the p-type cladding layer 25. The high resistance region L7 is formed through injecting an impurity including at least one kind selected from the group consisting of silicon (Si), aluminum (Al), oxygen (O) and boron (B) into the p-type cladding layer 25 from the bottom surface side of the groove 28. Thereby, a current to be injected from the p-side electrode 54 to the active layer 24 and a current (photocurrent) converted by the photoreceptor region L6 can be separated. As a result, there is little possibility of leaking a part of the current (photocurrent) converted by the photoreceptor region L6 to the ridge 27 side, or leaking a part of the current to be injected from the p-side electrode 54 to the active layer 24 to the p-side electrodes 53 (53a and 53b) side, so a loss of the current (photocurrent) converted by the photoreceptor region L6 can be prevented, and the entry of a current from the ridge 27 side can be prevented.

The laser diode 50 can be manufactured through the following steps. The same steps as those in the method of manufacturing the laser diode device 20 will not be further described.

After the step shown in FIG. 6B, an insulating film 61A is formed through laminating Si (refer to FIG. 12A). After that, a photoresist film R5 having an opening in a portion corresponding to the bottom surface of the groove 28 and the side surfaces of the ridge 27 is formed, and an exposed portion of the insulating film 61A is removed through the use of a wet etching method using, for example, a BHF solution so as to expose the side surfaces of the ridge 27 and the bottom portion of the groove 28, and thereby the insulating film 61 is formed (refer to FIG. 12B). After that, the photoresist film R5 is removed.

Next, after a photoresist film R6 having an opening in, for example, a region with a width of 1 μm from the side of the ridge 27 is formed on insulating film 61A, a part of the bottom portion of the groove 28 and the top surface of the p-side contact electrode 32, the above described ions are injected from the top surface of the bottom portion (the p-type cladding layer 25A) of the exposed groove 28 so as to form the high resistance region L7 (refer to FIG. 12C). After that, the photoresist film R6 is removed.

Figure 13A:
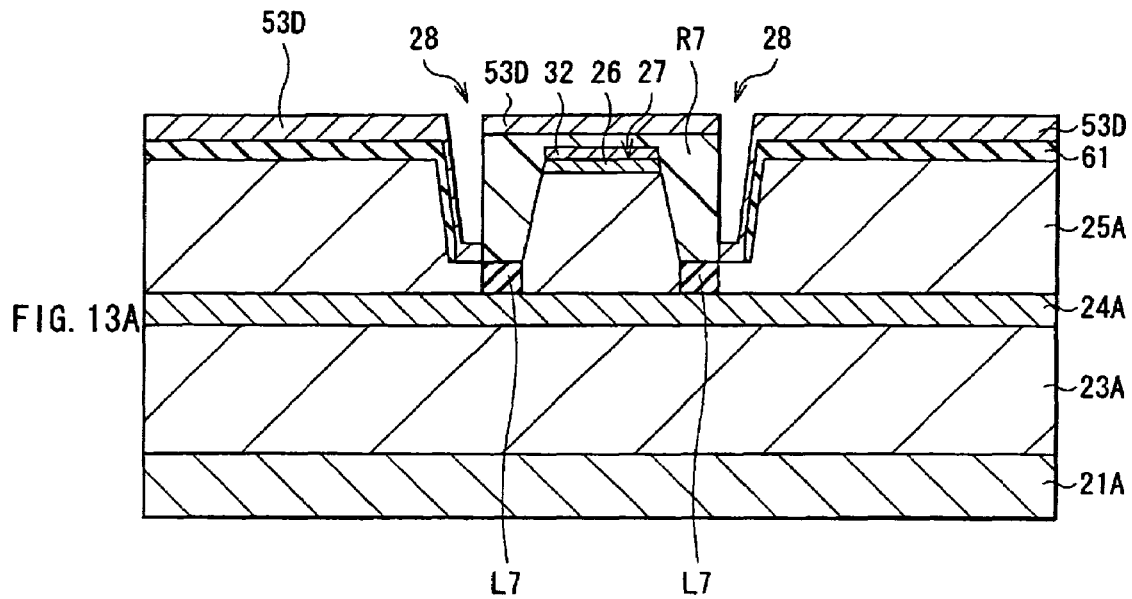
FIGS. 13A and 13B are sectional views showing steps following FIGS. 12A, 12B and 12C.

Next, a photoresist film R7 is formed on the side surfaces of the ridge 27 and the top surfaces of the p-side contact electrode 32 and the high resistance region L7, and each of the above-described materials is laminated with the same thickness by, for example, the CVD method to form a metal multilayer film 53D (refer to FIG. 13A). After that, the photoresist film R7 is removed by a lift-off method to form the p-side electrodes 53a and 53b.

Figure 13B:
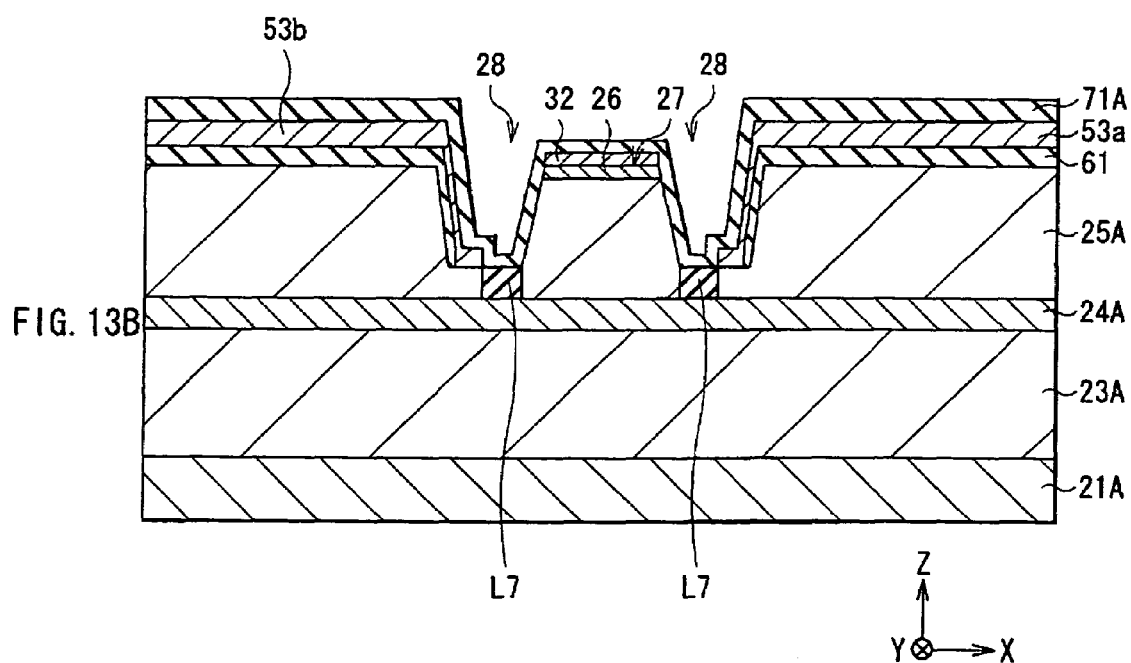

Then, an insulating film 71A is formed on the top surfaces of the p-side contact electrode 32, the high resistance region L7 and the p-side electrodes 53a and 53b and the side surfaces of the ridge 27 through laminating Si and $SiO_2$ by, for example, an evaporation method (refer to FIG. 13B).

Figure 14A:
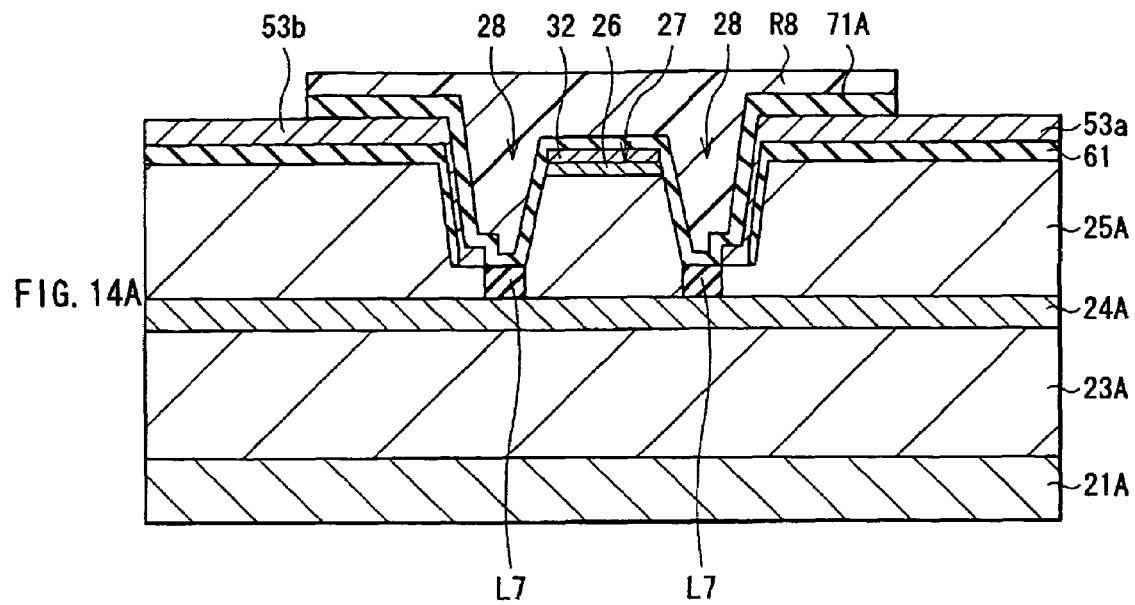
FIGS. 14A and 14B are sectional views showing steps following FIGS. 13A and 13B.

Next, after a photoresist film R8 is formed on the top surface of the insulating film 71A disposed 100 μm inside from the both end surfaces opposed to the lateral direction, an exposed portion of the insulating film 71A is removed by, for example, a wet etching method using the BHF solution so as to expose a part of the top surfaces of the p-side electrodes 53a and 53b (refer to FIG. 14A). After that, the photoresist film R8 is removed.

Figure 14B:
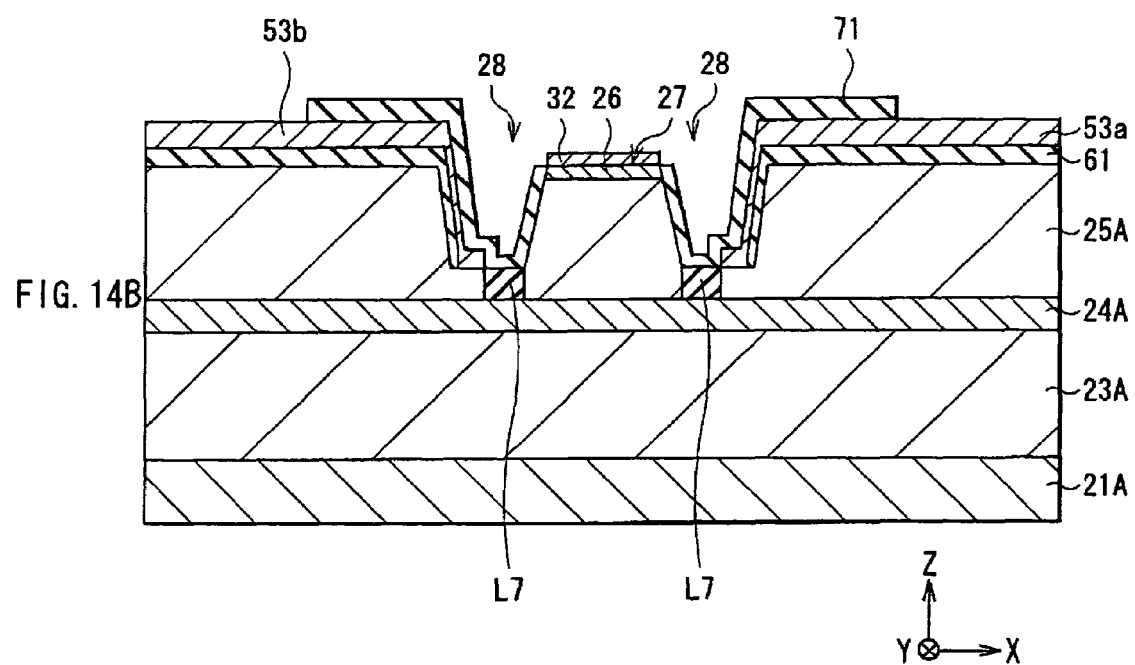

After that, a portion corresponding to the top surface of the p-side contact electrode 32 in the insulating film 71A is removed by, for example, a self-aligned process, and thereby the insulating film 71 is formed (refer to FIG. 14B).

Figure 15:
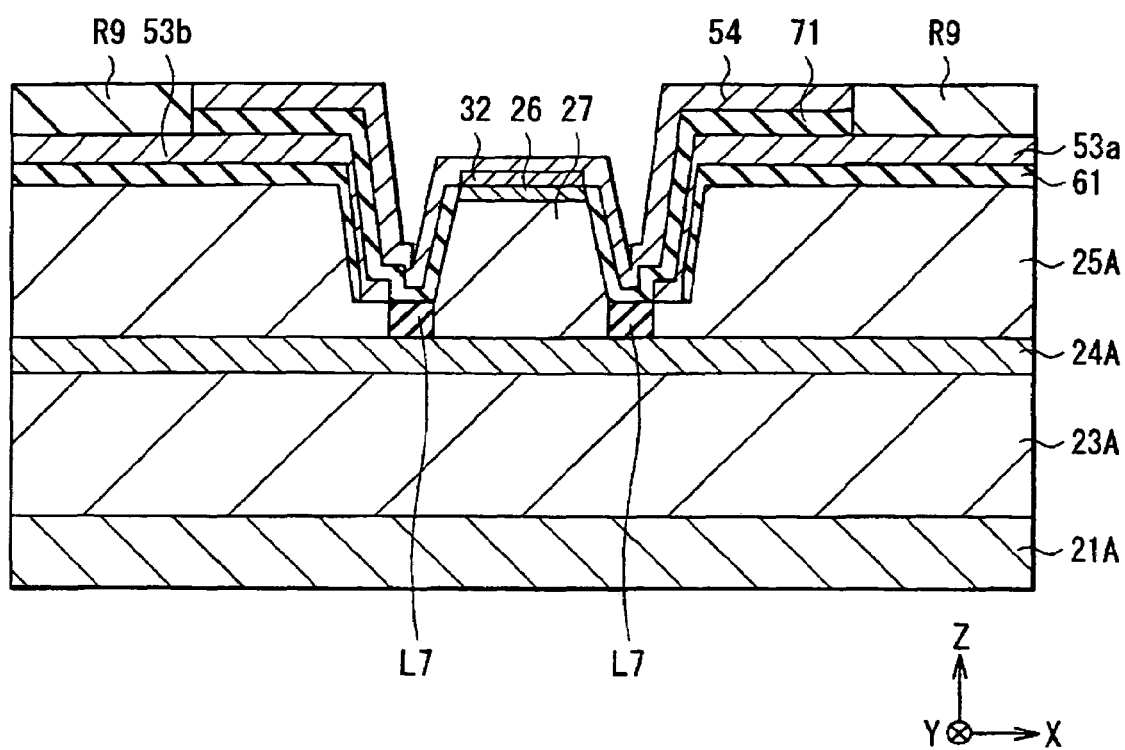
FIG. 15 is a sectional view showing a step following FIGS. 14A and 14B.

Next, after a photoresist film R9 is formed on the top surfaces of exposed portions of the p-side electrodes 53a and 53b, each of the above-described materials is laminated with the same thickness on the top surfaces of the p-side contact electrode 32 and the insulating film 71A by, for example, the CVD method so as to form the p-side electrode 54 (refer to FIG. 15). After that, the photoresist film R9 is removed, and thereby the laser diode is completed (refer to FIG. 11). Further, after that, the laser diode device shown in FIG. 10 is completed through the same steps as those of the above embodiment.

In the laser diode device according to the embodiment, laser light is emitted in a same manner as that in the first embodiment. At this time, the p-side electrode 33 is electrically connected to the light output arithmetic circuit via the wire W4, so light emitted in the gain region L4 is absorbed in the photoreceptor region L6 corresponding to the p-side electrode 53 of the active layer 24 so as to be converted into a current signal (photocurrent). The current signal is outputted to the light output arithmetic circuit via the wire W3. The current signal from the p-side electrode 53 is received in the light output arithmetic circuit as a light output monitor signal, and the magnitude of the output of laser light to be emitted is calculated by the above formula (1). As described above, the laser diode 50 includes a photodetector in the photoreceptor region L6, so it is not necessary to arrange a photodetector separately from the laser diode 50.

Thus, in the laser diode device according to the embodiment, the photoreceptor region L6 is disposed in a region corresponding to the p-side electrodes 53, and a part of the light emitted in the semiconductor layer 22 is absorbed so as to be converted into a light output monitor signal, so a current signal having a correlation with the magnitude of the output of the emitted laser light can be drawn, and it is not necessary to arrange a photodetector, such as a photodiode separately from the laser diode 50. Thereby, the laser diode device with a simple structure can detect the laser light.

Although the invention is described referring to the embodiments, the invention is not limited to the embodiment, and it can be variously modified.

For example, in the above embodiments, the case where the Group III-V nitride semiconductor is used as the material of the semiconductor layer 22 is described; however, a GaInP-based (red) semiconductor, an AlGaAs-based (infrared) semiconductor or the like may be used.

Moreover, in the above embodiments, an index guide type current confinement structure (W ridge structure) is arranged on the top of the semiconductor layer 22; however, any other current confinement structure, such as a gain guide type, may be used.

Further in the embodiments, the top portion of the semiconductor layer 22 has a p-type polarity and the bottom portion of the semiconductor layer 22 has an n-type polarity; however, the polarities may be reversed.

The invention is not limited to the manufacturing methods described in detail in the above embodiments, and any other manufacturing method may be used.

In the above embodiments, the laser diodes 20 and 50 are mounted so as to face the p-sides of them up; however, the p-sides may be faced down. The laser diodes 20 and 50 are preferably mounted so as to face the p-sides of them down, because the heat radiation efficiency and the laser characteristics can be improved, compared to the case where they are mounted so as to face the p-sides of them up.

Moreover, in the second embodiment, the case where the high resistance region L7 is arranged is described; however, instead of arranging the high resistance region L7, a distance between the active layer 24 and the bottom portion of the groove 28 may be reduced (narrowed), or to prevent damage to the active layer 24, the active layer 24 may be exposed so that the insulating film 71 extends to the top surface of the active layer 24.

It should be understood by those skilled in the art that various modifications, combinations, sub-combinations and alterations may occur depending on design requirements and other factors insofar as they are within the scope of the appended claims or the equivalents thereof.

What is claimed is:

1. A laser diode device, comprising:
    a semiconductor layer including an active layer, a first conductive type layer and a second conductive type layer;
    grooves extending into said second conductive type layer, said active layer being between said first conductive type layer and said second conductive type layer;
    a first electrode electrically connected to a ridge, said ridge being a portion of said second conductive type layer between said grooves;
    a second electrode electrically connected to said second conductive type layer, a contact portion of said second electrode being within at least one of the grooves;

a high resistance region in said second conductive type layer, said high resistance region being between said at least one of the grooves and said active layer,
wherein said semiconductor layer has a photoreceptor region and a gain region, said high resistance region being between said photoreceptor region and said gain region,
wherein said contact portion is electrically connected to said photoreceptor region.

2. The laser diode device according to claim 1, wherein said photoreceptor region absorbs a part of light emitted in said gain region and converts said part of the light into a current signal.

3. The laser diode device according to claim 1, wherein said high resistance region includes an impurity.

4. The laser diode device according to claim 3, wherein said impurity is from the group consisting of silicon (Si), oxygen (O), aluminum (Al) and boron (B).

5. The laser diode device according to claim 1, wherein an insulating film electrically isolates said first electrode from said second electrode.

6. The laser diode device according to claim 1, wherein said semiconductor layer is made of a Group III-V nitride compound semiconductor.

* * * * *